United States Patent
Incorvia et al.

(10) Patent No.: US 12,063,789 B2
(45) Date of Patent: Aug. 13, 2024

(54) SCANDIUM NITRIDE MAGNETIC TUNNEL JUNCTION DEVICE

(71) Applicant: BOARD OF REGENTS, THE UNIVERSITY OF TEXAS SYSTEM, Austin, TX (US)

(72) Inventors: Jean Anne Incorvia, Austin, TX (US); Suyogya Karki, Austin, TX (US); Daniel S. Marshall, Chandler, AZ (US)

(73) Assignee: Board of Regents, The University of Texas System, Austin, TX (US)

( * ) Notice: Subject to any disclaimer, the term of this patent is extended or adjusted under 35 U.S.C. 154(b) by 436 days.

(21) Appl. No.: 17/422,488

(22) PCT Filed: Jan. 16, 2020

(86) PCT No.: PCT/US2020/013789
§ 371 (c)(1),
(2) Date: Jul. 13, 2021

(87) PCT Pub. No.: WO2020/150419
PCT Pub. Date: Jul. 23, 2020

(65) Prior Publication Data
US 2022/0077233 A1 Mar. 10, 2022

(51) Int. Cl.
H10B 61/00 (2023.01)
G11C 11/16 (2006.01)
H10N 50/01 (2023.01)
H10N 50/85 (2023.01)

(52) U.S. Cl.
CPC .......... *H10B 61/00* (2023.02); *G11C 11/161* (2013.01); *H10N 50/01* (2023.02); *H10N 50/85* (2023.02)

(58) Field of Classification Search
CPC ...... H10B 61/00; G11C 11/161; H10N 50/01; H10N 50/85
USPC .......................................... 257/421
See application file for complete search history.

(56) References Cited

U.S. PATENT DOCUMENTS

| | | | |
|---|---|---|---|
| 6,347,049 B1 | 2/2002 | Childress et al. | |
| 6,806,096 B1 * | 10/2004 | Kim ............... | H10N 50/01 257/E27.005 |
| 7,270,896 B2 | 9/2007 | Parkin | |
| 7,443,639 B2 | 10/2008 | Parkin | |

(Continued)

OTHER PUBLICATIONS

International Search Report and Written Opinion dated Apr. 8, 2020, from International Application No. PCT/US2020/013789, 14 pages.

(Continued)

*Primary Examiner* — Mohammad M Hoque
(74) *Attorney, Agent, or Firm* — Meunier Carlin & Curfman LLC

(57) ABSTRACT

A magnetic tunnel junction device is disclosed comprising a first device layer comprising a material having a magnetic moment; a second device layer comprising a material having a magnetic moment, e.g., wherein the magnetic moment of the material of the second device layer is different from that of the material of the first device layer; and a barrier layer, e.g., tunnel barrier, having a first interface to the first device layer comprising predominantly of a scandium nitride (ScN) material and having a second interface to the second device layer comprising predominantly of a scandium nitride (ScN) material.

10 Claims, 12 Drawing Sheets

(56) References Cited

U.S. PATENT DOCUMENTS

| | | | |
|---|---|---|---|
| 2008/0291584 A1 | 11/2008 | Parkin | |
| 2012/0182647 A1* | 7/2012 | Fuke | G11B 5/3909 |
| 2016/0013397 A1 | 1/2016 | Toshiba | |
| 2016/0055891 A1* | 2/2016 | Aikawa | G11C 11/161 |
| | | | 365/158 |
| 2016/0072045 A1* | 3/2016 | Kanaya | H10N 50/10 |
| | | | 257/427 |
| 2016/0087004 A1* | 3/2016 | Sonoda | H10N 50/01 |
| | | | 257/421 |
| 2016/0087195 A1* | 3/2016 | Sonoda | H10N 50/01 |
| | | | 156/345.24 |
| 2016/0315250 A1* | 10/2016 | Guo | H10N 50/85 |
| 2016/0372212 A1* | 12/2016 | Kishi | G11C 29/50 |
| 2016/0380028 A1* | 12/2016 | Sonoda | H10N 50/01 |
| | | | 257/421 |
| 2017/0047085 A1* | 2/2017 | Noma | H10B 61/00 |
| 2017/0062706 A1* | 3/2017 | Yamakawa | H10N 50/85 |
| 2019/0280187 A1* | 9/2019 | Sonoda | H10N 50/80 |
| 2020/0119088 A1* | 4/2020 | Hashemi | H10N 50/01 |
| 2023/0039108 A1* | 2/2023 | Guo | H10N 50/80 |
| 2023/0067295 A1* | 3/2023 | Guo | H10N 50/01 |

OTHER PUBLICATIONS

Ordejón, P. et al. "Self-consistent order-N density-functional calculations for very large systems", Phys. Rev. B (Rapid Comm.) 53, R10441-10443 (1996).
Soler, J.M. et al. "The SIESTA method for ab initio order-N materials simulation", J. Phys.: Condens. Matt. 14, 2745-2779 (2002).
Butler, W. et al. "Spin-dependent tunneling conductance of Fe|MgO|Fe Sandwiches," Phys. Rev. B. 63 (2001).
Karpan, V.M. et al. "Graphite and Graphene as Perfect Spin Filters," Phys. Rev. Lett. 99, 176602 (2007).
Artacho, E. et al. "SIESTA 2.0 User's Guide" (2016).
Bose, T. et al. "First-principles study of the Fe | MgO(0 0 1) interface: magnetic anisotropy," J. Phys. Condens. Matter. 28 (2016).
Yuasa, S. et al. "230% room-temperature magnetoresistance in CoFeB/MgO/CoFeB magnetic tunnel junctions," Appl. Phys. Lett. 86, 092502 (2005).
Inferex S.A atomic structure retrieved from http://revistaialimentos.com/guia/classified/fluoruro-de-potasio-usp--674.html.

* cited by examiner

Bandgap of ScN = 2.37 eV

Bandgap of ScN = 2.70 eV

| Transport System | Total Transmission | | TMR (%) |
|---|---|---|---|
| | Parallel (arb.) | Antiparallel (arb.) | |
| Fe\|ScN(3 layers)\|Fe | 0.0091991 | 0.0037339 | 146 |
| Fe\|MgO(3 layers)\|Fe | 0.01047459 | 0.00206021 | 408 |
| Fe\|ScN(5 layers)\|Fe | 0.0537855 | 0.0077991 | 590 |

FIG. 15

SCANDIUM NITRIDE MAGNETIC TUNNEL JUNCTION DEVICE

RELATED APPLICATION

This International PCT application claims priority to, and the benefit of, U.S. Provisional Patent Application No. 62/793,154, filed Jan. 16, 2019, entitled "Scandium Nitride Magnetic Tunnel Junction Device," which is incorporated by reference herein in its entirety.

FIELD OF THE INVENTION

The present disclosure relates to magnetic tunnel junction (MTJ) devices for use in memory devices such as magnetic random-access memory (MRAM) cells, magnetic logic, and spintronic applications, as well as for magnetic tunnel junction sensors or biomarkers. More particularly, the present disclosure relates to a scandium-nitride-based magnetic tunnel junction device comprising a scandium-nitride tunnel barrier layer.

BACKGROUND

The basic component of a magnetic tunnel junction is a sandwich structure of two thin magnetic layers, e.g., ferromagnetic and/or ferrimagnetic layers, that are separated by a thin barrier layer comprising less than 100 atomic layers of material through which electrons can tunnel. The tunneling current is typically higher when the magnetic moments of the magnetic layers are parallel and is lower when the magnetic moments of the two magnetic layers are anti-parallel. The change in conductance for these two magnetic states can be described as a magneto-resistance and can be used, for example, as the basis to switch a memory cell between an "on" and "off" state.

Magnetic tunnel junction devices have been proposed as memory cells for non-volatile solid-state memory and sensors. In particular, spin transfer torque-magnetic random-access memory (STT-MRAM) has relied on Magnesium-oxide (MgO) thin film as a tunnel barrier for more than a decade. But, for tunneling current to occur through the MgO barrier layer, a 1-nm thick layer or so is often used, which corresponds to about 10-15 atomic layers of MgO. MgO presents growth challenges hindering its wide-use and acceptance, and small pinholes that can results in a grown barrier layer can provide a path for electrical conduction, suppressing the tunnel current. Further, due to the large MgO bandgap characteristics, increasing the MgO thickness past 1.5 nm to reduce pinholes severely increases the tunnel barrier resistance.

There is a need for, and a benefit to having, improved materials for magnetic tunnel junction devices.

SUMMARY

Scandium Nitride (ScN) magnetic tunnel junction device employs a ScN tunnel barrier (also referred to a ScN barrier layer). The Scandium Nitride (ScN) magnetic tunnel junction device may be grown with a thicker tunnel barrier layer as for example compared to an equivalent, or corresponding, MgO barrier layer. In some embodiment, a ScN barrier layer having a thickness greater than 1 nm and 1.5 nm can be produced, which eliminates, or at least minimizes, pinholes that can be created in existing MgO processes without sacrificing current performance. In addition, because of the rocksalt-crystal structure of the ScN barrier layer, and use of nitrogen, the resulting interface between the ScN barrier layer and the two device layers that surrounds the ScN layer can have less oxygen diffusion into the neighboring layers, reducing oxidation effects of the magnetic layers.

In an aspect, a magnetic tunnel junction device is disclosed comprising a first device layer comprising a material having a magnetic moment (e.g., a ferromagnetic material, a ferrimagnetic material, a magnetic material, e.g., Fe, Co, Ni, Fe-alloy, Ni-alloy, Fe—Co alloy, etc.); a second device layer comprising a material having a magnetic moment (e.g., wherein the magnetic moment of the material of the second device layer is different from that of the material of the first device layer) (e.g., a ferromagnetic material, a ferrimagnetic material, a magnetic material, e.g., Fe, Co, Ni, Fe-alloy, Ni-alloy, Fe—Co alloy, etc.); and a barrier layer (e.g., tunnel barrier) having a first interface to the first device layer comprising predominantly of a scandium nitride (ScN) material (e.g., a majority of the boundary region between the barrier layer and the first device layer is ScN) and having a second interface to the second device layer comprising predominantly of a scandium nitride (ScN) material (e.g., a majority of the boundary region between the barrier layer and the second device layer is ScN), wherein structure of the first device layer and the second device layer are arranged to invoke a different tunneling current depending on magnetization of the magnetic moment of the first device layer and the second device layer.

In some embodiments, the barrier layer is at least about 1 nm thick.

In some embodiments, the barrier layer is less than 1 nm thick (e.g., greater than 3 atomics layers).

In some embodiments, the barrier layer is at least less than about 5 nm thick.

In some embodiments, the barrier layer has a thickness substantially between about 1 nm thick and about 5 nm thick.

In some embodiments, the barrier layer is predominantly arranged, or includes a region that is predominantly arranged, in a rocksalt-crystalline structure.

In some embodiments, the first device layer is configured (shape and size) as an electrode (e.g., for magnetic tunnel junction sensor, a magnetic tunnel junction memory cell).

In some embodiments, the first device layer comprises, at the interface with the barrier layer, a material at selected from the group consisting of Fe, Co, Ni, Fe-alloy, Ni-alloy, Fe—Co alloy, Ga, Ga-alloy, Ga—Fe alloy, Fe—Ni—Co alloy, and a combination thereof.

In some embodiments, the first device layer and the second device layer substantially comprises the same material or alloy.

In some embodiments, the first device layer and the second device layer substantially comprises material or alloy having a different magnetic moment at the interface with the barrier layer (e.g., different material, different coupling to other layers, different thickness and/or geometric).

In some embodiments, the magnetic tunnel junction device forms one or more magnetic tunnel junction memory cell in a memory system (e.g., a spin transfer torque-magnetic random-access memory (STT-MRAM) device), spin-orbit torque random-access memory (SOT-MRAM), etc.).

In some embodiments, the magnetic tunnel junction device forms one or more magnetic tunnel junction sensor in a sensor device.

In some embodiments, the magnetic tunnel junction device forms one or more magnetic tunnel junction biomarker.

In some embodiments, the barrier layer is formed over magnetic-tunnel-junction active region of the device with a thickness selected from the group consisting of: between about 0.3 nm and about 1 nm, between about 1 nm and about 2 nm, between about 1 nm and about 3 nm, between about 1 nm and about 4 nm, between about 1 nm and about 5 nm, between about 2 nm and about 3 nm, between about 2 nm and about 4 nm, between about 2 nm and about 5 nm, between about 3 nm and about 4 nm, between about 3 nm and about 5 nm, between about 4 nm and about 5 nm, greater than 5 nm, and greater than about 10 nm.

In some embodiments, the tunneling current includes a spin-dependent tunneling having a sufficient "on" and "off" ratio.

In another aspect, a method is disclosed of producing a magnetic tunnel junction device. The method includes forming a first device layer (e.g., as a seed layer on an electrode or as an electrode) comprising a material having a first magnetic moment (e.g., a ferromagnetic material, a ferrimagnetic material, a magnetic material, e.g., Fe, Co, Ni, Fe-alloy, Ni-alloy, Fe—Co alloy, etc.); forming a barrier layer (e.g., via ion plating, ion implantation, sputtering, laser surface alloying, epitaxial growth, or other method of vapor deposition or crystal growth) over the first device layer, the barrier layer comprising ScN material (e.g., a thin-film) disposed between the first device layer; and forming a second magnetic layer over the barrier layer (e.g., via ion plating, ion implantation, sputtering, laser surface alloying, epitaxial growth, or other method of vapor deposition or crystal growth), the second device layer comprising a material having a second magnetic moment (e.g., a ferromagnetic material, a ferrimagnetic material, a magnetic material, e.g., Fe, Co, or Fe—Co alloy), wherein structure of the first device layer and the second device layer are arranged to invoke different tunneling current depending on magnetization of the magnetic moment of the first device layer and the second device layer.

In some embodiments, the method further includes depositing all the layers using physical vapor deposition; depositing a capping layer; forming a plurality of pillar structures; and patterning into a plurality of cells (e.g., magnetic random-access memory cells).

In some embodiments, the barrier layer is formed over magnetic-tunnel-junction active region of the device with a thickness selected from the group consisting of: between about 0.3 nm and about 1 nm, between about 1 nm and about 2 nm, between about 1 nm and about 3 nm, between about 1 nm and about 4 nm, between about 1 nm and about 5 nm, between about 2 nm and about 3 nm, between about 2 nm and about 4 nm, between about 2 nm and about 5 nm, between about 3 nm and about 4 nm, between about 3 nm and about 5 nm, between about 4 nm and about 5 nm, greater than 5 nm, and greater than about 10 nm.

In some embodiments, the magnetic tunnel junction device forms one or more magnetic tunnel junction memory cell in a memory system (e.g., a spin transfer torque-magnetic random-access memory (STT-MRAM) device), spin-orbit torque random-access memory (SOT-MRAM), etc.).

In some embodiments, the first device layer comprises, at the interface with the barrier layer, a material selected from the group consisting of Fe, Co, Ni, Fe-alloy, Ni-alloy, Fe—Co alloy, Ga, Ga-alloy, Ga—Fe alloy, Fe—Ni—Co alloy, and a combination thereof.

In some embodiments, the first device layer and the second device layer substantially comprises material or alloy having a different magnetic moment at the interface with the barrier layer (e.g., different material, different coupling to other layers, different thickness and/or geometric).

In an aspect, a magnetic random-access memory device (e.g., spin transfer torque-magnetic random-access memory (STT-MRAM) or spin-orbit torque random-access memory (SOT-MRAM)) is disclosed. The magnetic random-access memory device includes a first device layer comprising a material having a magnetic moment (e.g., a ferromagnetic material, a ferrimagnetic material, a magnetic material, e.g., Fe, Co, Ni, Fe-alloy, Ni-alloy, Fe—Co alloy, etc.); a second device layer comprising a material having a magnetic moment (e.g., wherein the magnetic moment of the material of the second device layer is different from that of the material of the first device layer) (e.g., a ferromagnetic material, a ferrimagnetic material, a magnetic material, e.g., Fe, Co, Ni, Fe-alloy, Ni-alloy, Fe—Co alloy, etc.); and a barrier layer (e.g., tunnel barrier) having a first interface to the first device layer comprising predominantly of a scandium nitride (ScN) material (e.g., a majority of the boundary region between the barrier layer and the first device layer is ScN) and having a second interface to the second device layer comprising predominantly of a scandium nitride (ScN) material (e.g., a majority of the boundary region between the barrier layer and the second device layer is ScN), wherein structure of the first device layer and the second device layer are arranged to invoke a different tunneling current depending on magnetization of the magnetic moment of the first device layer and the second device layer.

BRIEF DESCRIPTION OF THE DRAWINGS

Embodiments of the present invention may be better understood from the following detailed description when read in conjunction with the accompanying drawings. Such embodiments, which are for illustrative purposes only, depict novel and non-obvious aspects of the invention. The drawings include the following figures:

FIG. 15 shows a table of comparative simulation results illustrating tunneling effect of two configurations of ScN magnetic tunnel junctions in accordance with an illustrative embodiment.

DETAILED SPECIFICATION

Each and every feature described herein, and each and every combination of two or more of such features, is included within the scope of the present invention provided that the features included in such a combination are not mutually inconsistent.

Example Device

Figure 1A:
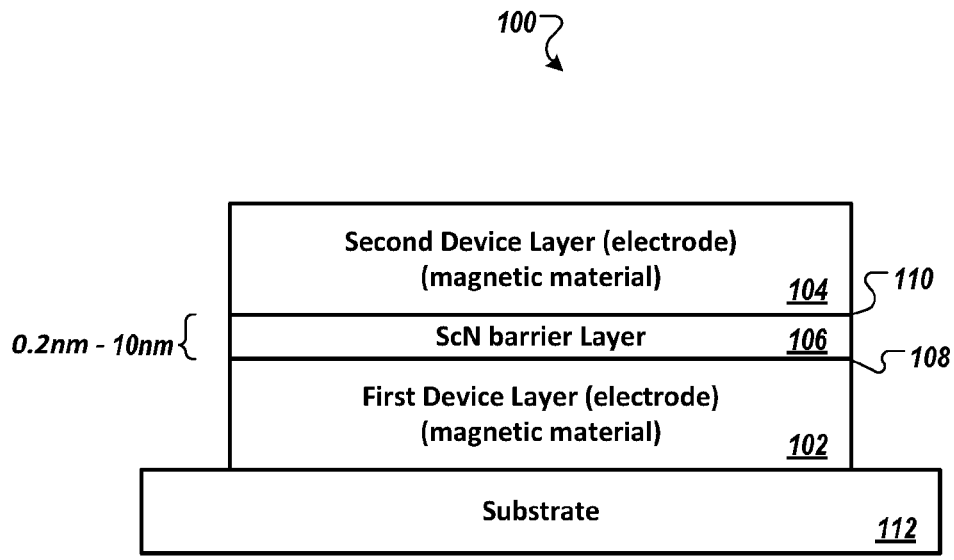
FIG. 1A shows an example scandium nitride magnetic tunnel junction device in accordance with an illustrative embodiment.

FIG. 1A shows an example scandium nitride magnetic tunnel junction device 100 in accordance with an illustrative embodiment. The scandium nitride magnetic tunnel junction device 100 includes a first device layer 102 comprising a material having a first magnetic moment and a second device layer 104 comprising a material having a second magnetic moment. The scandium nitride magnetic tunnel junction device 100 includes a barrier layer 106 (e.g., also referred to as a tunnel barrier) having a first interface 108 to the first device layer comprising predominantly of a scandium nitride (ScN) material and a second interface 110 to the second device layer 104 also comprising predominantly of a scandium nitride (ScN) material. The interfaces between the device layers and the barrier layer (e.g., 108, 110) are predominantly scandium nitride when the majority of the boundary region between the barrier layer and the device layer comprises a scandium nitride crystal.

The scandium nitride (ScN) barrier layer is 106 is configured, in some embodiments, as a thin film having a thickness of about 0.2 nm to 10 nm. In some embodiments, the barrier layer is predominantly arranged, or includes a region that is predominantly arranged, in a rocksalt-crystalline structure. The rocksalt-crystalline structure provides a uniform structure that allows for magnetic spin to be transferred between the first device layer 102 and the second device layer 104 across the barrier layer 106.

In some embodiments, a thin film ScN barrier layer about 0.3 nm to 5 nm thick is formed between two electrode layers having a magnetic moment (e.g., Fe, Ni, Co, or Fe—Co alloy ferromagnetic layers). In some embodiments, the barrier layer is formed over magnetic-tunnel-junction active region of the device with a thickness selected from the group consisting of: between about 0.3 nm and about 1 nm, between about 1 nm and about 2 nm, between about 1 nm and about 3 nm, between about 1 nm and about 4 nm, between about 1 nm and about 5 nm, between about 2 nm and about 3 nm, between about 2 nm and about 4 nm, between about 2 nm and about 5 nm, between about 3 nm and about 4 nm, between about 3 nm and about 5 nm, and between about 4 nm and about 5 nm, greater than 5 nm, and greater than about 10 nm. In some embodiments, the first device layer 102 comprises a magnetic material (e.g., a ferromagnetic, ferrimagnetic, e.g., Fe, Co, Ni, Fe-alloy, Ni-alloy, Fe—Co alloy, Ga, Ga-alloy, Ga—Fe alloy, Fe—Ni—Co alloy, and a combination thereof) having a first magnetic moment, and the second device layer 104 comprises a magnetic material (e.g., a ferromagnetic, ferrimagnetic, e.g., Fe, Co, Ni, Fe-alloy, Ni-alloy, Fe—Co alloy, Ga, Ga-alloy, Ga—Fe alloy, Fe—Ni—Co alloy, and a combination thereof) having a second magnetic moment. The scandium nitride magnetic tunnel junction device may have an atomic lattice that may include a number of layers of ScN comprising scandium atoms and nitrogen atoms configured in a rock-salt crystalline structure.

In FIG. 1A, the atoms of the first device layer 102 are configured with a first magnetic moment, and the atoms of the second device layer 104 are configured with a second magnetic moment. When an intended external bias is applied (e.g., voltage or current) between the device layers (e.g. 102 and 104), spin-dependent tunneling may be established based on the relative magnetization of the two magnetic layers.

The materials of the first device layer 102 and the second device layer 104 can be the same or they can be different to establish a different magnetic switching characteristic. In other embodiments, the geometric shape or thickness of the first device layer 102 and the second device layer 104 is used to establish a different magnetic moment. In other embodiments, different coupling to other layers of different material is used to establish a different magnetic moment.

Figure 1B:
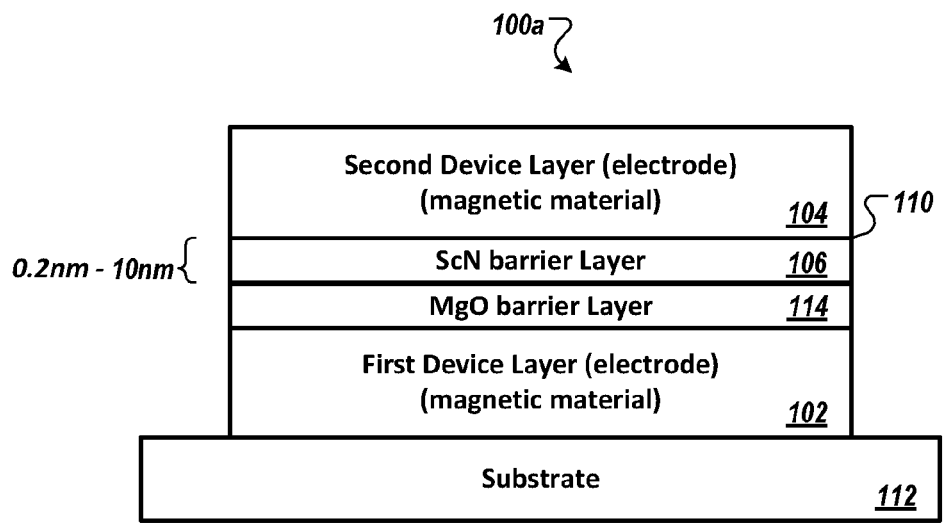
FIG. 1B shows an example scandium nitride magnetic tunnel junction device in accordance with another illustrative embodiment.

FIG. 1B is another example scandium nitride magnetic tunnel junction device 100 (shown as 100a) in accordance with an illustrative embodiment. The scandium nitride magnetic tunnel junction device 100b includes a second tunnel barrier layer 114, e.g., comprising a MgO layer. The second tunnel barrier layer 114 maybe formed via epitaxial growth, e.g., to serve as a seed layer for the ScN layer 106 to promote the correct crystal symmetry of the tunnel barrier.

Figure 2:
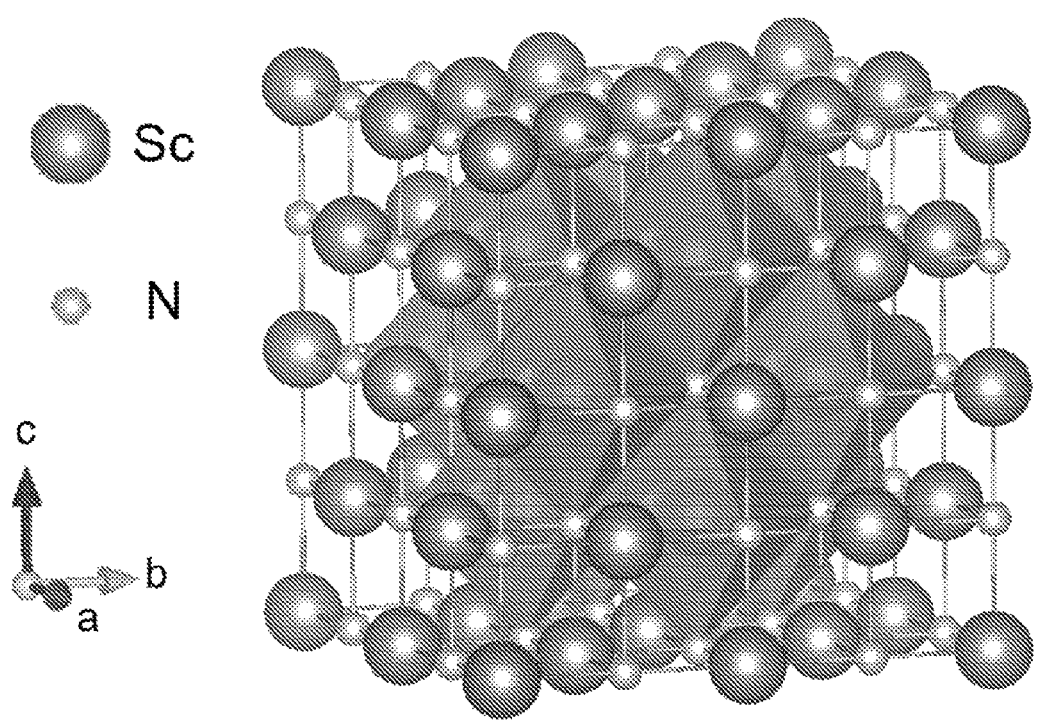
FIG. 2 is a diagram illustrating a rock-salt crystalline structure of Sc and N atoms in the ScN barrier layer of a ScN magnetic tunnel junction device in accordance with an illustrative embodiment.

FIG. 2 is a diagram illustrating a rock-salt crystalline structure in an example ScN barrier layer in a ScN magnetic tunnel junction device in accordance with an illustrative embodiment. Specifically, FIG. 2 shows an example three-dimensional crystalline structure of the ScN barrier layer (e.g., 106) in the ScN magnetic tunnel junction device 100.

Figure 3A:
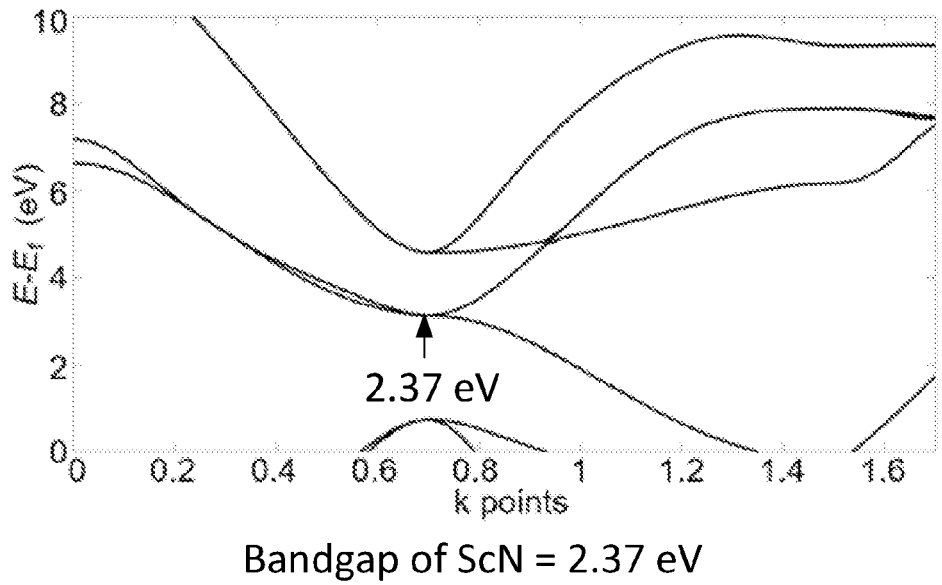
FIG. 3A shows simulated bandgap properties of ScN in a stimulated magnetic tunnel junction device accordance with an illustrative embodiment.

FIG. 3A shows simulated bandgap properties of ScN in a simulated magnetic tunnel junction in accordance with an illustrative embodiment. Specifically, FIG. 3A shows simulated band structure of ScN relative to the Fermi energy E in a SIESTA supercomputing stimulation. FIG. 3A shows the simulated bandgap of the ScN structure is of 2.37 eV at 0.7 in the k point (shown in the x-axis), which agrees with its theoretical value. In FIG. 3A, the fermi energy is shown leveled at 0.8. In comparison, the simulated MgO bandgap is 7.8 eV. Indeed, it is expected that thicker tunnel barrier layer can be formed in a ScN magnetic tunnel junction for use in a magnetic tunnel junction device.

Figure 3B:
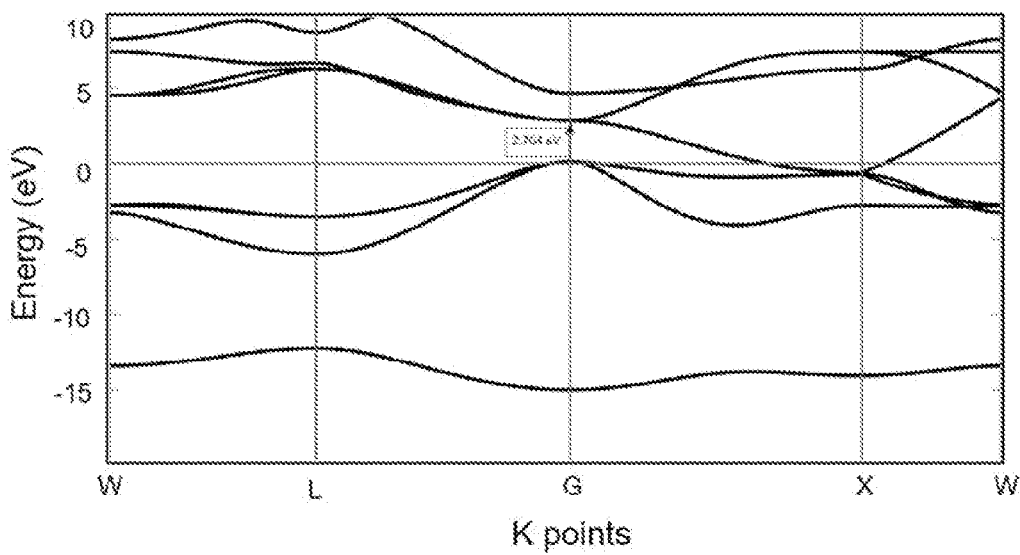
FIG. 3B shows additional simulated bandgap properties of ScN in a simulated magnetic tunnel junction in accordance with an illustrative embodiment.

FIG. 3B shows additional simulated bandgap properties of ScN in magnetic tunnel junction in accordance with an illustrative embodiment. Specifically, FIG. 3B shows band structures of ScN relative to the Fermi energy E in a VASP supercomputing stimulation. FIG. 3B shows the simulated bandgap of the ScN structure is of 2.704 eV at the gamma point, which is consistent the stimulation results from the SIESTA supercomputing stimulation of FIG. 3A. The fermi energy is shown leveled at zero.

Figure 3C:
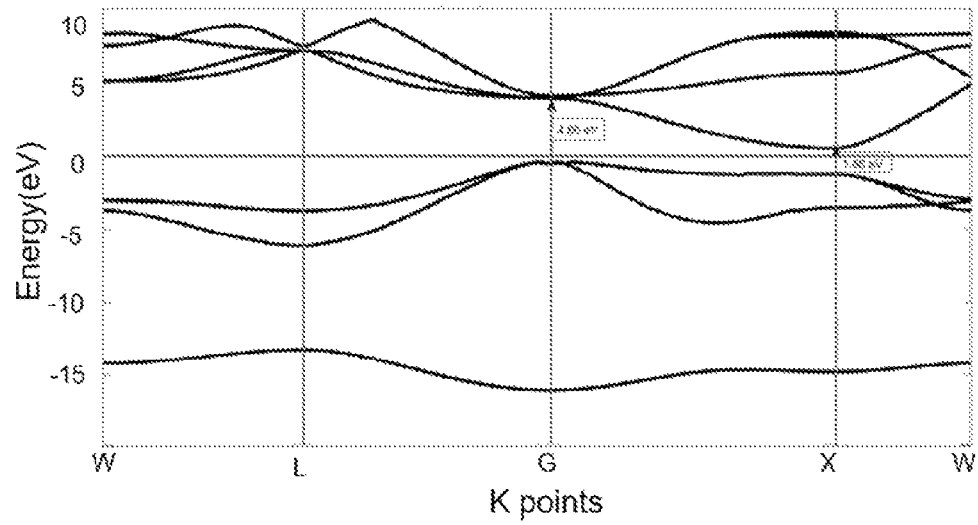
FIG. 3C shows additional simulated bandgap properties of ScN in a simulated magnetic tunnel junction device of FIG. 3B with Hubbard connections applied in accordance with an illustrative embodiment.

FIG. 3C shows additional simulated bandgap properties of ScN in magnetic tunnel junction with Hubbard connections applied in accordance with an illustrative embodiment. Specifically, FIG. 3C shows the simulated bandgap properties of ScN in a magnetic tunnel junction with a 6-eV Hubbard connectional applied to the Sc atoms.

Figure 4:
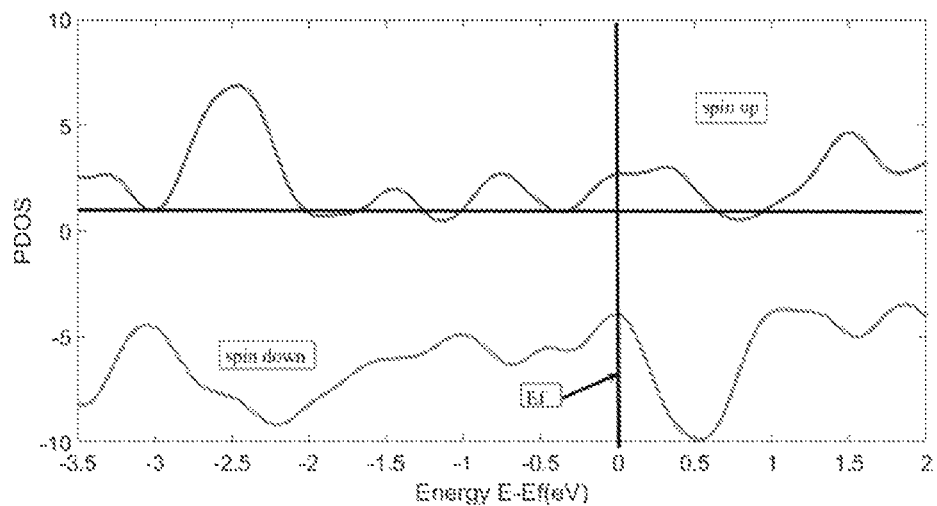
FIG. 4 shows stimulated partial density of states (PDOS) plot of spin-up ($\uparrow$) and spin-down ($\downarrow$) states at the interface between the ScN barrier layer and an Fe magnetic device layer in accordance with an illustrative embodiment.

FIG. 4 shows partial density of states (DOS) plot of spin-up (1) and spin-down (4) states at the interface between an example ScN barrier layer (e.g., 106) and a magnetic device layer (e.g., 102, 104) in accordance with an illustrative embodiment. The partial density of states show different expected behavior in the spin up and spin down configurations.

Magnetic Junction Tunnel Memory Device

Figure 5:
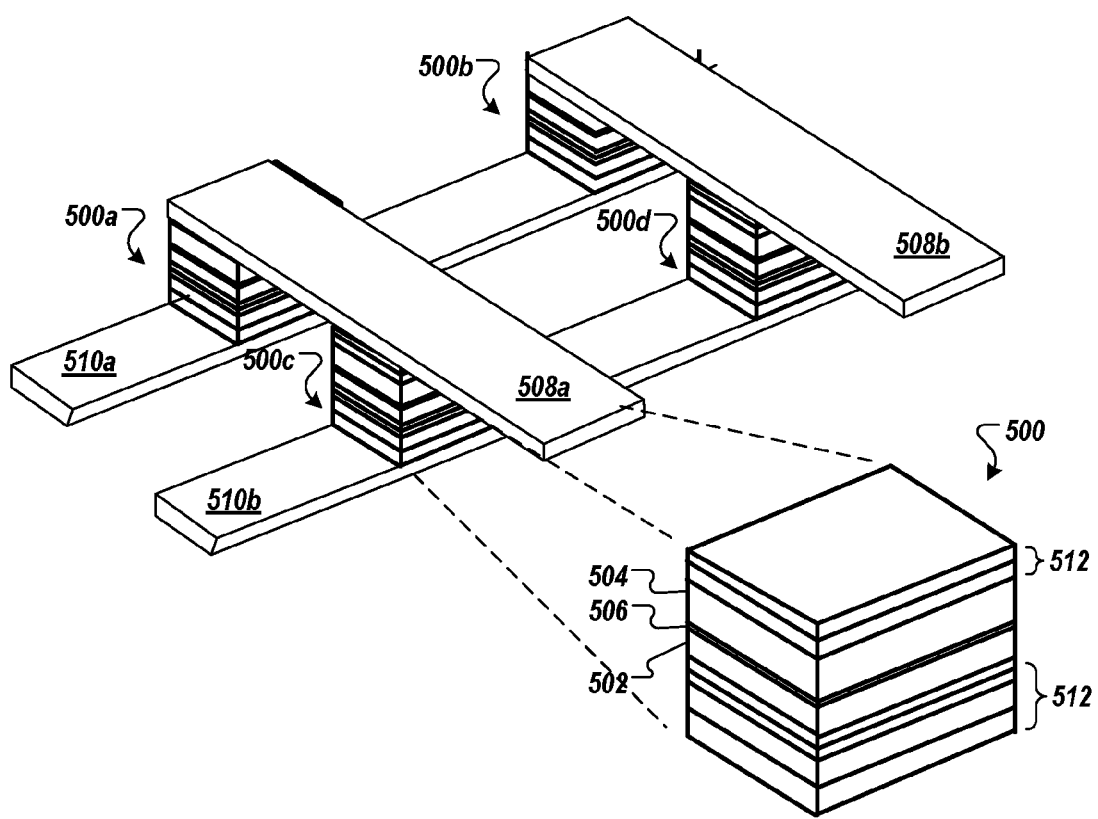
FIG. 5 is a diagram showing an example ScN magnetic tunnel junction device MRAM configured as a nonvolatile ScN-MTJ magnetic random-access memory in an array of individual ScN-MTJ magnetic memory cells in accordance with an illustrative embodiment.

FIG. 5 is a diagram showing an example ScN magnetic tunnel junction device 100 (shown as 500) MRAM configured as a nonvolatile ScN-MTJ magnetic random-access memory (MRAM) in an array of individual ScN-MTJ magnetic memory cells (shown as 500a, 500b, 500c, 500d) in accordance with an illustrative embodiment. Indeed, the ScN magnetic tunnel junction device 100 (e.g., 500) can be configured as a spin transfer torque-magnetic random-access memory (STT-MRAM) device or a spin-orbit torque random-access memory (SOT-MRAM).

As shown in FIG. 5, the ScN magnetic tunnel junction device 500, in some embodiments, includes a first device layer (e.g., 502) comprising a material having a magnetic moment, e.g., a ferromagnetic material, a ferrimagnetic material, a magnetic material, e.g., Fe, Co, Ni, Fe-alloy, Ni-alloy, Fe—Co alloy, etc., and a second device layer (e.g., 504) comprising a material having a magnetic moment in which the magnetic moment of the material of the second device layer is different from that of the material of the first device layer, e.g., a ferromagnetic material, a ferrimagnetic material, a magnetic material, e.g., Fe, Co, Ni, Fe-alloy, Ni-alloy, Fe—Co alloy, etc.. The device 500 further includes a barrier layer (e.g., tunnel barrier) (e.g., 506) having a first interface to the first device layer comprising predominantly of a scandium nitride (ScN) material, e.g., where a majority of the boundary region between the barrier layer and the first device layer is ScN, and having a second interface to the second device layer comprising predominantly of a scandium nitride (ScN) material, e.g., where a majority of the boundary region between the barrier layer and the second device layer is ScN. The structures of the first device layer and the second device layer are arranged to invoke a different tunneling current depending on magnetization of the magnetic moment of the first device layer and the second device layer.

In FIG. 5, the ScN magnetic tunnel junction device 100 (shown as 500) is configured to form each individual memory cell. The top and bottom magnetic device layers (e.g., 102, 104) (shown as 502 and 504) in contact with the ScN barrier layer 106 (shown as 506) that forms the ScN magnetic tunnel junction device 500 are configured so that its magnetization direction can rotate between a parallel state and an antiparallel state, and, in some embodiments, in in-between magnetic states.

In integrated device, each ScN-MTJ memory cell 500a-d is configured, in some embodiments, to have a high resistance across a very small surface area over a controlled thickness of the tunnel barrier layer, which provides an electrical barrier height for the tunnel barrier layer. In some embodiments, and as shown in FIG. 5, each of the ScN-MTJ memory cells 500a-d in the array is controlled by two sets of addressable lines. The first set of addressable line are shown as 508a, 508b, and the second set of addressable line shown as 510a and 510b. The addressable line can provide write currents to change the ScN-MTJ magnetic states. Use of write currents can cause rotation of the magnetization of the magnetic device layers (e.g., 502, 504) that pass through the ScN tunnel barrier layer. In FIG. 5, the ScN-MTJ memory cell, including the top and bottom magnetic device layers (e.g., 502, 504) and the ScN barrier layer (e.g., 506) are arranged in a vertical structure to form pillars that interconnects with read/write lines.

The ScN magnetic tunnel junction device may include additional layers 512 in the thin film stack, e.g., similar to MgO-based MTJs, to fix the magnetization direction of the top and bottom magnetic device layers (e.g., 102, 104), including, for example, not limited to, a substrate layer, a capping layer, adhesion layer, additional magnetic layers, etc. Examples of such structures to which the ScN barrier layer as discussed herein can be used as a substitute for MgO barrier layer are provided in U.S. Pat. Nos. 6,347,049, 7,443,639, and 7,270,896, among others, each of which is incorporated by reference herein in its entirety. Other structure, dimensions, material, and layer thicknesses may be used beyond those recited in the provided patent references.

Experimental Results

To establish the feasibility of the use of ScN as a tunnel barrier in a magnetic tunnel junction device, a study was conducted. In the study, density-functional theory and non-equilibrium Green's function methods were used in supercomputing simulations to model the interface and spin dependent transport properties for a ScN magnetic junction device comprising a Fe|ScN|Fe structure. Prior to this study, no other study has been conducted to evaluate ScN for use in a magnetic tunnel junction device. It is expected that similar spin-dependent tunneling can be achieved as MgO with a smaller bandgap of ScN that can be advantageous for some applications.

In the study, several supercomputer-based simulations were conducted. A first simulations was conducted using the SIESTA simulation tool. Subsequent supercomputing simulations were conducted using the VASP simulation tool.

The resulting models of the first set of conducted simulations and subsequent simulations show a projected density of states versus energy of the interface between the first layer of Fe and ScN that indicates that ScN barrier layer can likely be used to produce magnetic tunnel junction effects similar to MgO. These results may be used for the development of STT-MRAM, and other MTJ device applications, including, e.g., sensors and biomarkers, by reducing variability and increasing the ease of the MTJ fabrication process.

SIESTA Simulation. In the instant study, Kohn-Sham self-consistent method using local density approximation was first used, i.e., via SIESTA code, to model convergence of the tunnel junction system. From the simulation, it was observed that the first interface between the top electrode layer and the ScN barrier layer shows the spin-up/-down projected density of states near the Fermi level analogous to the magnetic structure of a Fe|MgO interface. To this end, these results show that a similar spin-dependent tunneling can be generated using ScN barrier layer as that generated using a MgO barrier layer. Further, the results show the advantageous smaller bandgap of ScN.

Specifically, in the study, a supercomputer model was generated of the Fe|ScN|Fe spin dependent transport of a central scattering region of a scandium nitride (ScN) barrier layer and two semi-infinite electrodes of Iron (Fe) along a transport "z" direction (also referred to herein as the "Z-axis").

To set up the model, first, the atomic layers of the ScN barrier layer were converged along the transport "z" direction, "Z axis", in a main input file (.fdf file) for running in the SIESTA simulation tool. SIESTA ("Spanish Initiative for Electronic Simulations with Thousands of Atoms") is a computer program (and corresponding method) that can perform electronic structure calculations and ab initio molecular dynamics simulations of molecules and solids using Kohn-Sham self-consistent density functional method in local density (LDA-LSD), generalized gradient (GGA) approximations, and non-local functional that includes van der Waals interactions (VDW-DF), etc. Description of configuration can be found in "Self-consistent order-N density-functional calculations for very large systems", P. Ordejón, E. Artacho and J. M. Soler, Phys. Rev. B (Rapid Comm.) 53, R10441-10443 (1996) and "The SIESTA method for ab initio order-N materials simulation", J. M. Soler, E. Artacho, J. D. Gale, A. García, J. Junquera, P. Ordejón, and D. Sanchez-Portal, J. Phys.: Condens. Matt. 14, 2745-2779 (2002), each of which are incorporated by reference herein in its entirety.

The simulation used norm-conserving pseudopotential in its fully nonlocal (Klein-Bylander) form. A pseudopotential file (.psf file) was prepared for each element specified in the main .fdf file. For the simulation, the pseudopotential .psf file of Scandium, Nitrogen, Magnesium and Oxygen was obtained from the Abinit's pseudo database. The pseudopotential file (.psf) was checked using the ATOM program prior to running in SIESTA. Inputs to the main .fdf file were then defined including the general description for the ScN barrier layer per Table 1.

TABLE 1

SystemName: ScN
SystemLabel: Scandium Nitride
NumberOfSpecies: 2 pseudopotential-Sc and N (Number of different atomic species in the simulation. Atoms of the same species, but with a different pseudopotential or basis set are counted as different species).
NumberOfAtoms: 3 layers (The number of atoms used in the simulation, which depends on the number of atomic layers to be used in the simulation).
ChemicalSpeciesLabel: (Specifies the different chemical species that are present, assigning them a number for further identification).
%block Chemical_Species_label
1 7 N
2 21 Sc
%endblock Chemical_Species_label In the pseudopotential .psf file, the plane wave basis calculation was established for each element to model the self-convergence of the ScN barrier layer. A k-grid of 3*3*1 was used as the converged k-grid. DZP (double zeta polarization basis set) was used as the basis size to establish atomic orbitals for the simulation. Depending on the convergence criteria, the basis were optimized with single zeta or single zeta polarization.

Once the convergence of the k points was performed, the band gap of ScN was evaluated, which is theoretically given to be from 2.1 eV to 3.2 eV. From the converged structure of ScN, a bandgap of 2.37 eV was calculated, as shown in FIG. 3A. The output from .band file was used to plot the bandgap of FIG. 3A.

The simulation of the converged structure produced coordinates of the atoms in an .xyz file. These output were imported to the VESTA visualization software to draw the structure of the ScN barrier layer. VESTA is a 3D visualization program for structural models, volumetric data such as electron/nuclear densities, and crystal morphologies. Description of VESTA can be found at http://jp-minerals.org/vesta/en/. The same method was used to visualize the structural relaxation of the Fe atom with self-convergence. Two Fe structure were marked as a left and right electrode, and the ScN barrier layer were marked as the scattering region with a k grid of 1 along the transport(z) direction.

In the main .fdf file of the Fe electrode, the atomic coordinates were then arranged, and the solution method was changed to TranSIESTA calculations. After that, the simulation was converged for the minimum energy.

Using TranSIETA as the method, both a .TSDE density matrix and energy density matrix file and a corresponding. TSHS Hamiltonian file were generated. These .TSHS and .TSDE files of the Fe electrode were then added to the main .fdf file of the ScN barrier layer. The spin states in both electrodes were then set and another convergence was run with bias voltage at the left electrode starting from the value of 0.2 V. The process was repeated for several values of bias voltage in the left electrode. For every bias voltage, current was measured in the right electrode for both parallel and antiparallel state. The electric current values in the second electrode were plotted for the different bias voltages in an IV plot. This IV plot was used to derive the value for the resistance in both parallel and antiparallel states. These resistance values across various bias voltages were then used to calculate tunneling magnetoresistance TMR (in percent) in Equation 1.

$$TMR = \frac{Rap - Rp}{Rp} * 100 \qquad \text{(Equation 1)}$$

where $R_{ap}$ and $R_p$ is resistance in antiparallel and parallel respectively.

Figure 6:
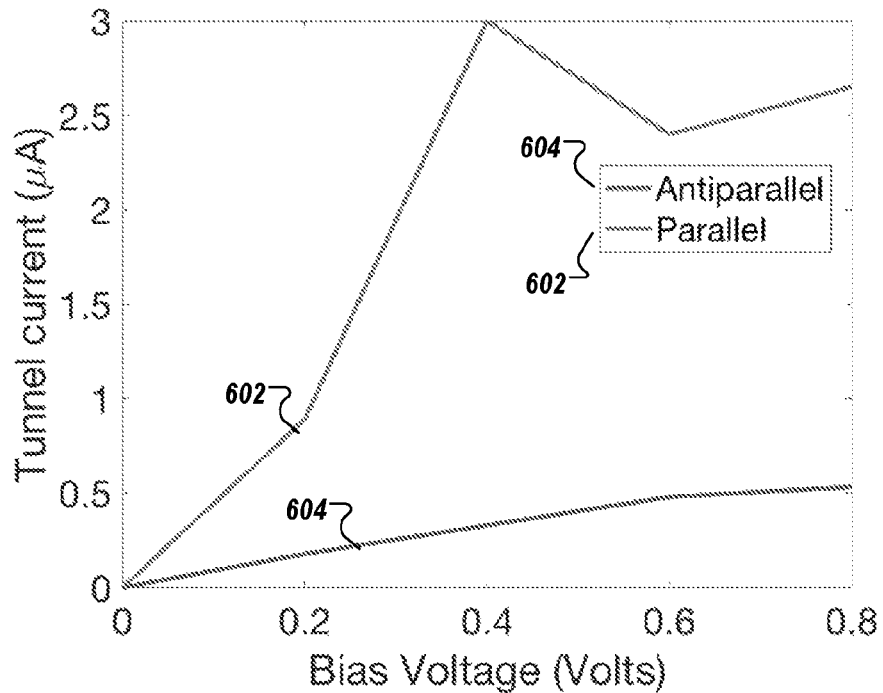
FIGS. 6 and 7 each shows density functional theory (DFT) modeling results for a ScN magnetic junction tunnel device via a Fe|ScN|Fe transport in accordance with an illustrative embodiment.
Figure 7:
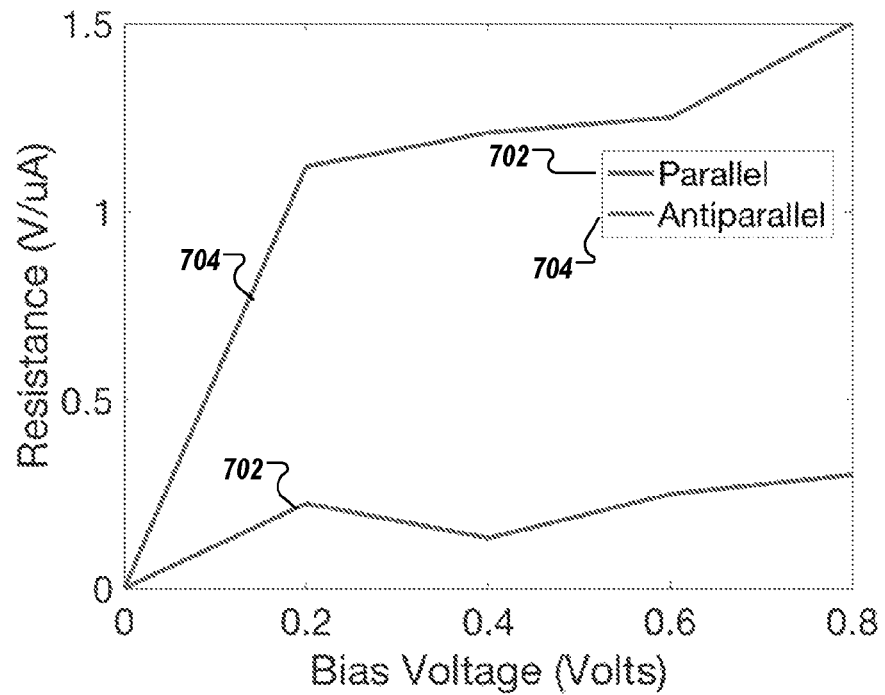

FIGS. 6 and 7 each shows density functional theory (DFT) modeling results for a ScN magnetic junction tunnel device via a Fe|ScN|Fe transport, in accordance with an illustrative embodiment.

Specifically, FIG. 6 shows theoretical tunnel current performance (in μA) of the ScN magnetic junction tunnel device via a Fe|ScN|Fe transport for a parallel state (602) and an antiparallel state (604) across a plurality of bias voltages. FIG. 7 shows theoretical magnetoresistance performance (in V/μA) of the ScN magnetic junction tunnel device via a Fe|ScN|Fe transport for a parallel state (702) and an antiparallel state (704) across a plurality of bias voltages.

Figure 8:
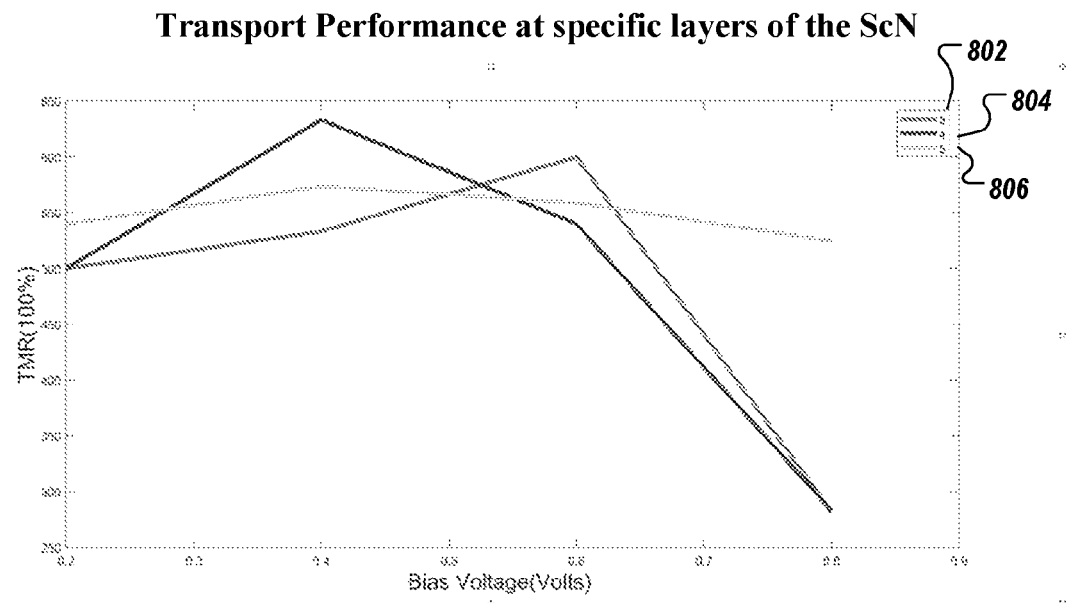
FIG. 8 shows simulated transport calculation at specific layers of the ScN barrier layer in accordance with an illustrative embodiment.

FIG. 8 shows simulated transport calculation at specific layers of the ScN barrier layer in accordance with an illustrative embodiment. In the simulation, 3 atomic layers of ScN were modeled (802), 4 atomic layers of ScN were modeled (804), and 5 atomic layers of ScN were modeled (806).

Figure 9:
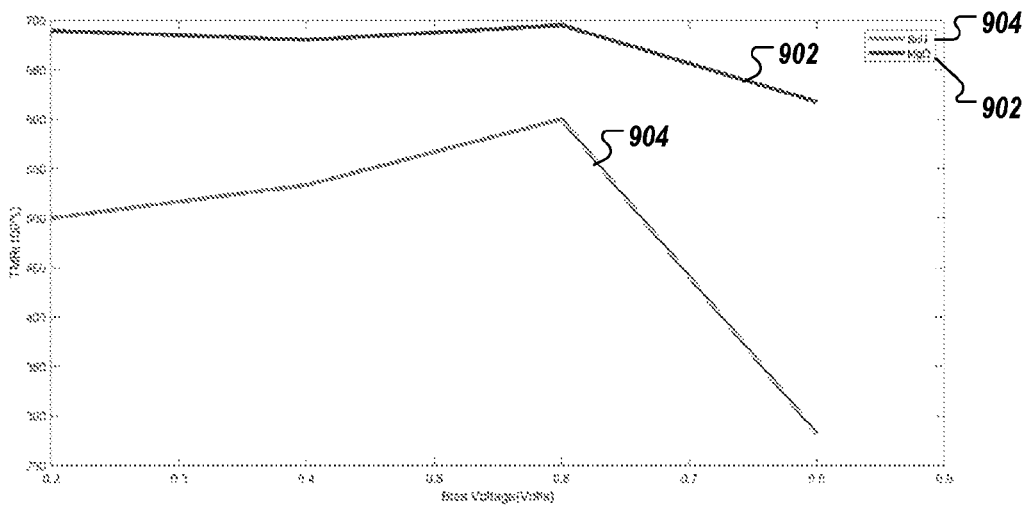
FIG. 9 shows a comparison of simulated tunneling magnetoresistance (TMR(%)) values for 4 modeled atomic layers of MgO and 4 modeled atomic layers of ScN at several bias voltages, ranging from 0.2 V to 0.9 V in accordance with an illustrative embodiment.

As part of the study, similar methodology were used to calculate the tunneling magnetoresistance (TMR) for a MgO-based junction as a comparison. FIG. 9 shows a comparison of simulated tunneling magnetoresistance (TMR(%)) values for 4 modeled atomic layers of MgO (902) and 4 modeled atomic layers of ScN (904) at several bias voltages, ranging from 0.2 V to 0.9 V. Indeed, as shown in FIG. 9, a simulated ScN barrier layer produced tunneling magnetoresistance comparable to a MgO barrier layer, indicating that a fabricated ScN barrier layer can be used to produce magnetic tunnel junction effects similar to MgO (which has been established to produce magnetic tunnel junctions). That is, simulated results show that a ScN barrier layer can be used to provide spin-dependent tunneling across magnetic device layers (e.g., 102, 104) of a magnetic junction device and, thus, the resistance of the magnetic junction device can be affected by the magnetization of the magnetic device layers (e.g., 102, 104).

Figure 10:
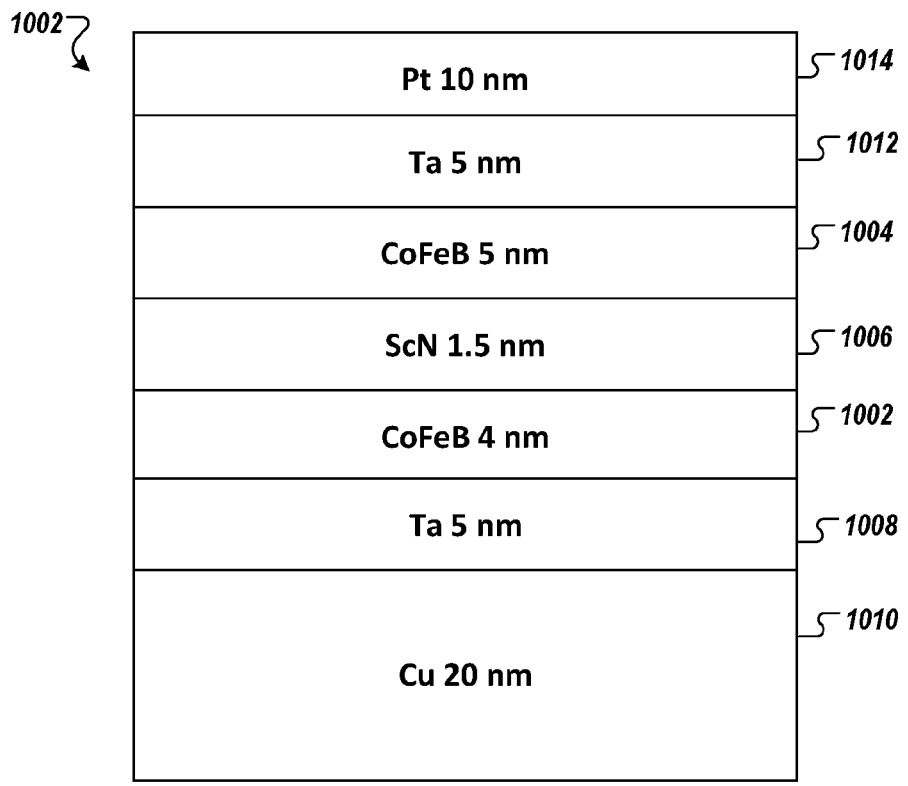
FIG. 10 shows an example ScN magnetic tunnel junction device with various capping and substrate layers in accordance with an illustrative embodiment.

FIG. 10 shows an example ScN magnetic tunnel junction device 1002 with various capping and substrate layers, in accordance with an illustrative embodiment. The ScN magnetic tunnel junction device 1002 includes a ScN barrier layer 106 (shown as 1006) that is contact with two device layers 102, 104 comprising a Cobalt-Iron-Boron (CoFeB) alloy (shown as 1002 and 1004). The ScN magnetic tunnel junction device 1002 further includes a Tantalum (1012) and Platinum 1012 capping layers and a Tantalum layer 1008 to adhere the magnetic device layer 1002 to a copper layer 1010 on a silicon/silicon oxide substrate (not shown).

Figure 11:
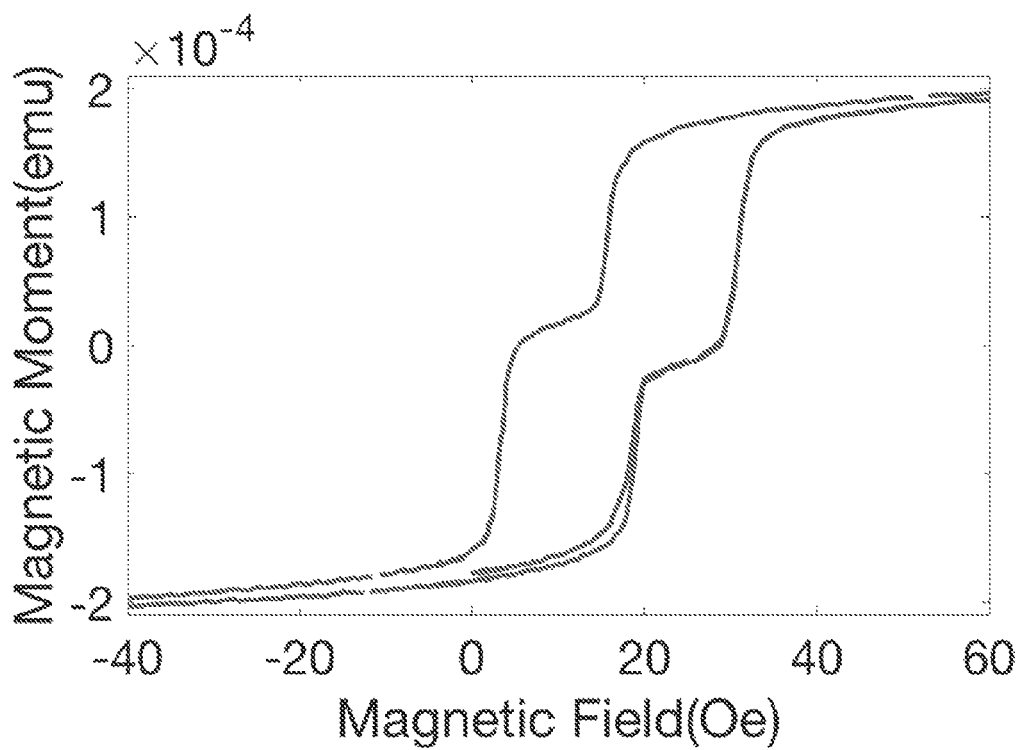
FIG. 11 shows a hysteresis loop of the magnetic tunnel junction device of FIG. 10 which shows separate switching at different fields of the two magnetic layers of the device.

FIG. 11 shows a hysteresis loop of the magnetic tunnel junction device of FIG. 10, which show the separate switching at different fields of the two magnetic layers of the device. In this example device, the magnetic layers have in-plane magnetic anisotropy, although the magnetic layers could also have perpendicular magnetic anisotropy or an in-between anisotropy. In this example, an in-plane magnetic field is swept from 60 Oe to −40 Oe and back to 60 Oe. It is observed that the two magnetic layers switch separately, for example, at about 15 Oe and 5 Oe. The data shows that the two magnetic layers (e.g., 104 and 106) in a Sc magnetic junction device are capable of being decoupled by a 1.5-nm thick ScN tunnel barrier.

Figure 12:
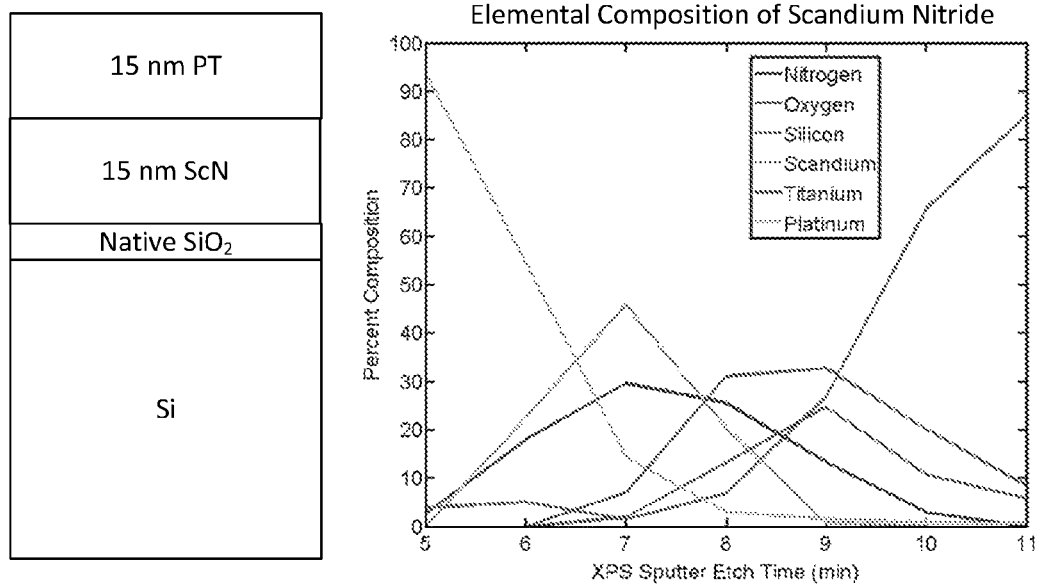
FIG. 12 shows details of deposition growth of a ScN layer on a Si/SiO$_2$ substrate in accordance with an illustrative embodiment.

FIG. 12 shows details of deposition growth of a ScN layer on a $Si/SiO_2$ substrate in accordance with an illustrative embodiment. In FIG. 12, x-ray photoelectron spectroscopy (XPS) data shows ScN can be grown via sputter deposition to form a ScN barrier layer, e.g., in a ScN MTJ device. The data also shows that the technique does not necessarily produce scandium-oxide. The data is associated with a thin film stack of 15-nm ScN and15-nm Pt that was sputter deposited on a $Si/SiO_2$ substrate at low base pressure (e.g., where the base pressure was $2\times10^{-8}$ Torr). The x-ray photoelectron spectroscopy (XPS) data shows that after deposition, as the stack is etched back and the layers are measured, Sc (scandium) and N (nitrogen) are seen separate from O (oxygen).

Figure 13:
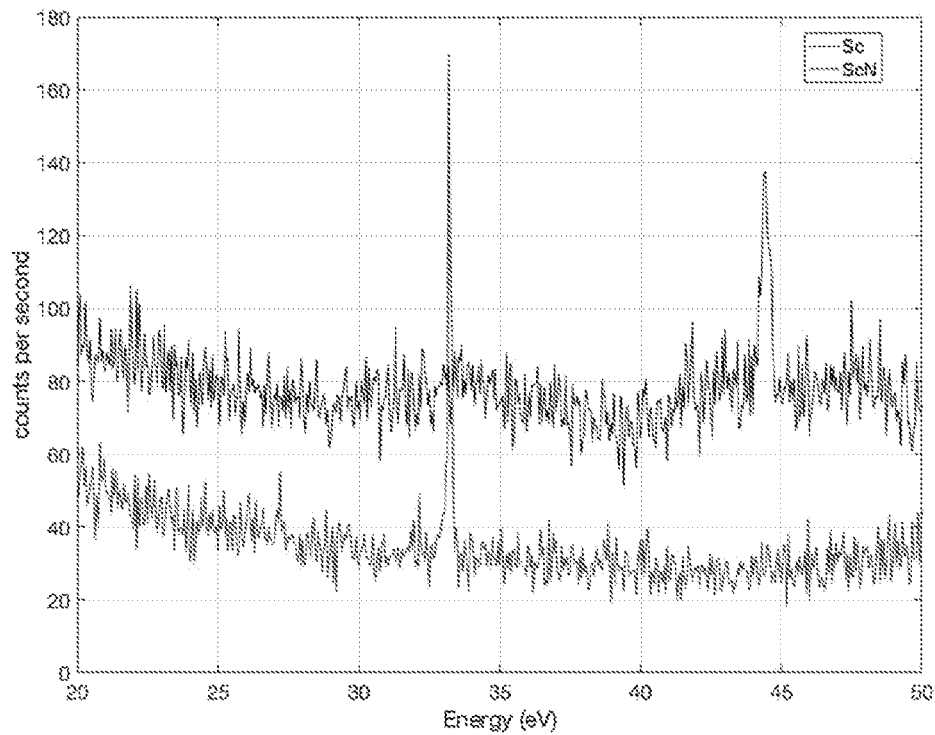
FIG. 13 shows x-ray diffraction (XRD) data of a formed ScN layer formed from a sputtered deposition of Sc in an Ar/N gas environment in accordance with an illustrative embodiment.

FIG. 13 shows x-ray diffraction (XRD) data of sputter deposition of Sc in an Ar/N gas to produce a deposited ScN layer in accordance with an illustrative embodiment. In FIG. 13, sputter deposition of Sc gas in an Ar gas is shown via line 1302, and sputter deposition of Sc gas in an Ar/N gas to produce a ScN layer is shown via line 1304. Indeed, sputter deposition, among other techniques, may potentially be used to generate the ScN structures as discussed herein.

VASP Simulation. A subsequent supercomputer model was generated, via the VASP simulation tool, of the Fe|ScN|Fe spin dependent transport. The VASP simulation also evaluated a Fe|ScN|Fe spin dependent transport of a central scattering region of a scandium nitride (ScN) barrier layer and two semi-infinite electrodes of Iron (Fe) along a transport "z" direction (also referred to herein as the "Z-axis") (shown also as "c" axis). In the VASP stimulation, the ScN barrier region was rotated 45 degrees along the transport "z" direction.

Figure 14:
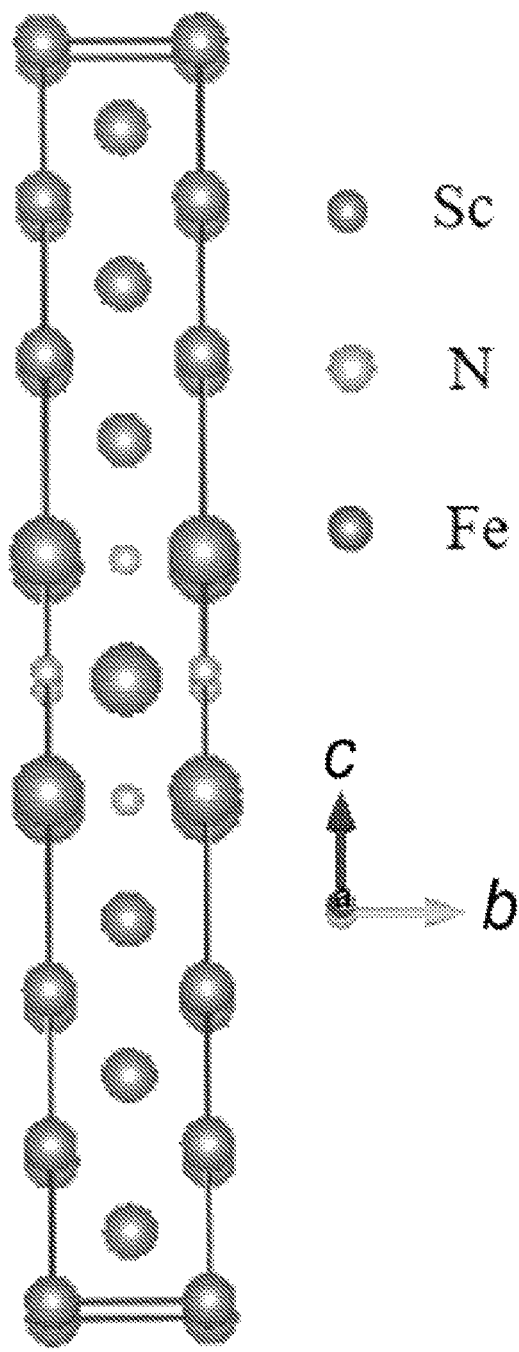
FIG. 14 shows a computer-computing simulation setup for a transport evaluation of a scandium nitride (ScN) structure in accordance with an illustrative embodiment.

FIG. 14 shows a computer-computing simulation setup for a transport evaluation of a scandium nitride (ScN) structure in accordance with an illustrative embodiment. As shown in FIG. 14, the rotated structure resulted in N atoms sitting right on top of Fe atoms at the interface.

To set up the model in the VASP simulation tool, the atomic layers of the ScN barrier layer were initially relaxed for minimum free energy change and band structure change of $10^{-5}$. "VASP (The Vienna Ab initio Simulation Package)" is a computer program that can perform atomic scale materials modeling, e.g., electronic structure calculations and quantum-mechanical molecular dynamics, from first principles. The calculations were done using Kohn-Sham self-consistent density functional method in local density (LDA-LSD), generalized gradient (GGA) approximations, and non-local functional that includes van der Waals interactions (VDW-DF), etc. Additional description of the configuration is described in P. Ordejón, E. Artacho and J. M. Soler, "Self-consistent order-N density-functional calculations for very large systems", Phys. Rev. B (Rapid Comm.) 53, R10441-10443 (1996), which is incorporated by reference herein.

For the VASP stimulation, four main input files in the VASP simulations were prepared and included the incar, poscar, potcar and kpoints files. A pseudopotential file, which is the potcar file, was prepared for each element specified in the poscar file, which contains the position data of every element. For the simulation, the pseudopotential file with information for scandium, nitrogen, magnesium and oxygen atoms was obtained from the VASP data base. The incar file contains all the input tags necessary for the simulation of the system. Table 2 shows an example incar file used in the simulation.

TABLE 2

| |
|---|
| System = ScN |
| ISTART = 0; ICHARG = 2 |
| PREC = high |
| #Electronic Relaxation |
| NELM = 100 |
| NELMIN = 5 |
| EDIFF = 1E−05 |
| ISMEAR = 0 |
| SIGMA = 0.01 |
| ISPIN = 2% spin polarized calculation |
| ALGO = Fast |
| LREAL= Auto |
| LSORBIT = .FALSE. % no spin orbit |
| NCORE = 4 |
| % For addition of Hubbard Potential to 3 d Orbital of Sc |
| LDAU = .TRUE. |
| LDAUL = 3 −1 −1 |
| LDAUU = 6.0 0.0 0.0 |

In the input of the kpoint file, the plane wave basis calculation was established for each element to model the self-convergence of the ScN barrier layer. A k-grid of 11×11×11 elements was used as the converged k-grid with minimum energy.

Once the convergence analysis of the k points was performed, the study evaluated the band gap of ScN, which was stimulated to be from 2.1 eV to 3.2 eV. From the converged structure, as shown in FIG. 3B of ScN, a gap of 2.704e V is obtained at the gamma point. The study added a Hubbard correctional potential to the 3d orbital of the scandium atom. This resulted in a direct bandgap of 4.66 eV at the gamma point and 1.86e V at the X point as shown in FIG. 3C.

The coordinates of the converged system were written in contcar file, which was one of the outputs of VASP simulation. These coordinates were imported to the VESTA visualization software for visualization of the symmetry of the converged ScN barrier layer as shown in FIG. 2. VESTA is a 3D visualization program for structural models, volumetric data such as electron/nuclear densities, and crystal morphologies. Description of VESTA may be found at http://jp-minerals.org/vesta/en/. A similar method was used to visualize the structural relaxation of the Fe atom with self-convergence.

In the study, the coordinates from the converged system were then used in QUANTUM ESPRESSO analysis for transport calculations. QUANTUM ESPRESSO is an integrated open-source computer codes for electronic-structure calculations and materials modeling at nanoscale. In the analysis, self-consistency field calculations were conducted separately for ScN barrier region and for the Fe electrodes on the respective left and the right side of the barrier. These self-consistency calculations generated the wave functions to be used for the transmission calculations. Then, using PWCOND tool, the study calculated the conductance for each system. The code of the PWCOND tool is designed to study quantum systems with open boundary conditions consisting of semi-infinite left and right leads bridged by the scattering region, e.g., by solving the quantum-mechanical scattering problem to find reflection $r_{ij}$ and transmission $t_{ij}$ amplitudes for electron waves j propagating from the left to the right. The total transmission at the Fermi energy, $T(E_F) = \Sigma_{ij}|t_{ij}(E_F)|^2$, then determines the linear ballistic conductance, G, via Landauer-Buttiker formula, $G=(e^2/h)T(E_F)$, where $E_F$ is the energy at fermi level, e is the charge of an electron, and h is Planck's constant.

Table 3 shows example input of a PWCOND file used in the VASP stimulation.

The transmission values were calculated for both the parallel and antiparallel magnetic configurations of each system. In the parallel configuration, the Fe atoms on both the left and right electrode were configured with a spin up with ispin="1". In the antiparallel configuration, the Fe atoms on the left electrode were configured with a spin up with ispin="1" and the right electrode were configured with a spin down with ispin="2". From the Landauer-Buttiker formula, the conductance values were calculated to provide the resistance values for both parallel ($R_p$) and antiparallel ($R_{ap}$) systems. The tunneling magnetoresistance (TMR) values for each system were calculated per Equation 1.

As part of the study, similar methodology was used via VASP simulation to also calculate the tunneling magnetoresistance (TMR) for a MgO-based junction as a comparison. FIG. 15 shows a table of comparative simulation results between tunneling effect of two configurations of ScN magnetic tunnel junctions as compared to MgO magnetic tunnel junction in accordance with an illustrative embodiment. Specifically, FIG. 15 shows a comparison of simulated tunneling magnetoresistance (TMR(%)) value for 3 atomic layers of a MgO device to 3 and 5 atomic layers of a ScN device. Indeed, as shown in results in FIG. 15, it is observed that a ScN barrier layer can produce tunneling magnetoresistance comparable to a MgO barrier layer, indicating that ScN barrier layer may be used to produce magnetic tunnel junction effects similar to those of MgO. That is, the VASP simulated results, consistent with SIESTA simulation, also show that ScN barrier layer can be used to provide spin-dependent tunneling across the magnetic device layers in a ScN magnetic junction device (e.g., 500, 500a, 500b, 500c, 500d).

Discussion

Spin transfer torque-magnetic random-access memory (STT-MRAM) has relied on MgO tunnel barrier-based magnetic tunnel junctions (MTJs) since the discovered improvements of such structures over $Al_2O_3$ a decade ago. But, MgO presents growth challenges hindering wide use and acceptance. Small pinholes in the barrier provide a path for electrical conduction, suppressing the tunnel current. Due to the large MgO bandgap, increasing the MgO thickness past 1.5 nm to reduce pinholes may severely increase the tunnel barrier resistance. This can lead to large device variations and the need for highly precise growth conditions.

Scandium Nitride (ScN) magnetic tunnel junctions provide an alternative that can overcome these challenges. The smaller bandgap of ScN compared to MgO may allow for

TABLE 3

```
&inputcond
  prefixl='lead_up',         % left electrode
  prefixr='lead_down',       % right electrode
  prefixs='ScN',             % barrier region which specifies the layer thickness as well
  tran_file='trans_up.out',
  ikind=2,                   % calculation type, "2" = unequal leads for transmission
  iofspin = 1,               % index of spin for incoming plane waves for transmission
("1" is spin up, 2 is spin down)
  energy0=0.00d0,            % initial energy point sampled in e V
  ewind=8.d0,                %"the energy window for reduction of 2D plane wave basis set
(in XY)"
  bds=10.1537,               %length of scattering region to consider in z in alat units
  epsproj=1.d-8,             %"accuracy of 2d basis set reduction"
  nz1 = 15,                  %number of subslabs in slab for integrating over in transmission
  &
  0
  100 100 0 0                %automatic 100x100 k grid in xy to sample over
  1                          %sampling at 1 energy point, which we set to 0 eV
``` use of a thicker tunnel barrier, eliminating pinholes associated with MgO manufacturing without sacrificing current performance. Additionally, ScN has a similar rocksalt-crystal structure to MgO and Nitrogen that could reduce oxygen diffusion into the magnetic electrodes.

A 0.2-10 nm thick ScN sandwiched between Fe, Co, or Fe—Co alloy ferromagnetic layers, among other materials discussed herein is contemplated. There could be additional layers to the thin film stack similar to MgO-based MTJs, including those discussed those herein, among others.

Per the study described herein (e.g., using density-functional theory and nonequilibrium Green's function methods), the interface and spin dependent transport properties of Fe|ScN|Fe has been modeled, which shows the projected density of states versus energy of the interface between the layers of Fe and ScN. These results show that there is an expected similar spin-dependent tunneling performance as MgO with the advantageous smaller bandgap of ScN.

Figure 16:
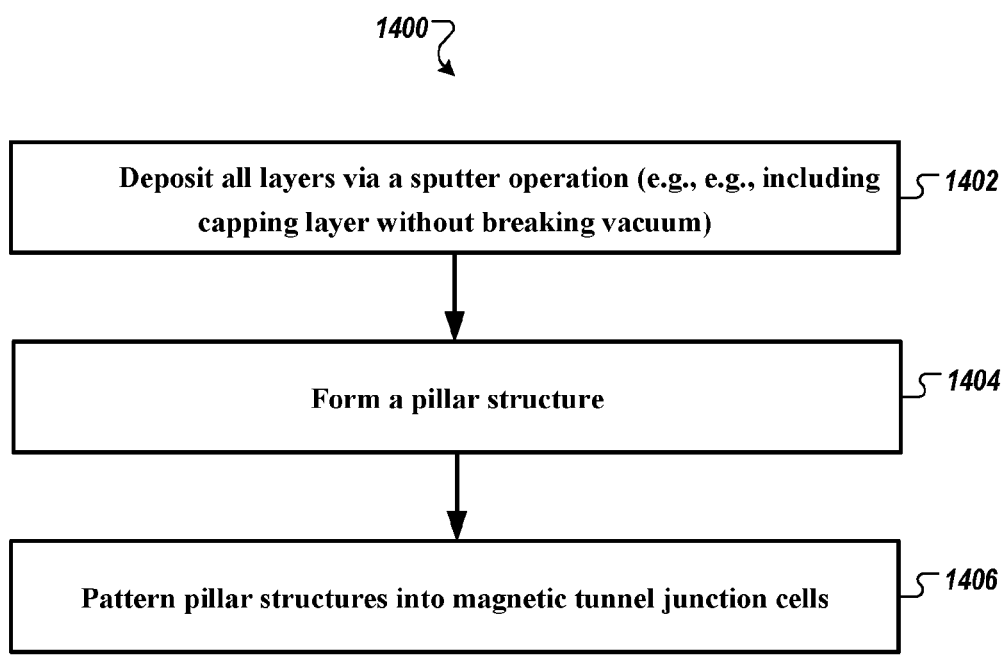
FIG. 16 is a diagram showing a method of fabricating a scandium nitride (ScN) magnetic tunnel junction device in accordance with an illustrative embodiment.

Example of Method of Fabricating Scandium Nitride (ScN) Magnetic Tunnel Junction Device FIG. 16 is a diagram showing a method of fabricating a scandium nitride (ScN) magnetic tunnel junction device in accordance with an illustrative embodiment.

The method includes forming (1602) a first device layer (e.g., as a seed/first layer on an electrode or as an electrode) comprising a material having a first magnetic moment (e.g., a ferromagnetic material, a ferrimagnetic material, a magnetic material, e.g., Fe, Co, Ni, Fe-alloy, Ni-alloy, Fe—Co alloy, etc.). Step 1602 may include forming a barrier layer (e.g., via ion plating, ion implantation, sputtering, laser surface alloying, epitaxial, or other method of vapor deposition or crystal growth) over the first device layer in which the barrier layer comprises a ScN material (e.g., a thin-film) disposed between the first device layer. Step 1602 may include forming a second magnetic layer over the barrier layer (e.g., via ion plating, ion implantation, sputtering, laser surface alloying, epitaxial, or other method of vapor deposition or crystal growth). The second device layer may include a material having a second magnetic moment (e.g., a ferromagnetic material, a ferrimagnetic material, a magnetic material, e.g., Fe, Co, or Fe—Co alloy) in which structure of the first device layer and the second device layer are arranged to invoke different tunneling current depending on magnetization of the magnetic moment of the first device layer and the second device layer.

Because scandium is highly reactive to oxygen, the layers in some embodiments are grown (step 1402) (e.g., via sputter deposition) under very low base pressure and with care to avoid oxygen in the system. In some embodiments, the samples are capped after patterning to prevent oxygen diffusion to the tunnel barrier.

The step of forming the barrier layer can be configured to form the barrier layer with a thickness between about 0.3 nm and about 1 nm in some embodiments. In other embodiments, the step of forming the barrier layer can be configured to form the barrier layer with a thickness between about 1 nm and about 2 nm. In other embodiments, the step of forming the barrier layer can be configured to form the barrier layer with a thickness between about 1 nm and about 3 nm. In other embodiments, the step of forming the barrier layer can be configured to form the barrier layer with a thickness between about 1 nm and about 4 nm, between about 1 nm and about 5 nm. In other embodiments, the step of forming the barrier layer can be configured to form the barrier layer with a thickness between about 2 nm and about 3 nm. In other embodiments, the step of forming the barrier layer can be configured to form the barrier layer with a thickness between about 2 nm and about 4 nm. In other embodiments, the step of forming the barrier layer can be configured to form the barrier layer with a thickness between about 2 nm and about 5 nm. In other embodiments, the step of forming the barrier layer can be configured to form the barrier layer with a thickness between about 3 nm and about 4 nm. In other embodiments, the step of forming the barrier layer can be configured to form the barrier layer with a thickness between about 3 nm and about 5 nm. In other embodiments, the step of forming the barrier layer can be configured to form the barrier layer with a thickness between about 4 nm and about 5 nm. In other embodiments, the step of forming the barrier layer can be configured to form the barrier layer with a thickness greater than 5 nm. In other embodiments, the step of forming the barrier layer can be configured to form the barrier layer with a thickness greater than about 10 nm.

Referring still to FIG. 16, in some embodiments, the method 1400 includes depositing capping layers; forming (step 1406) a plurality of pillar structures; and patterning (1408) into a plurality of cells (e.g., magnetic random-access memory cell). Techniques as used to generate such structures in MgO MTJ devices as described in U.S. Pat. Nos. 6,347,049, 7,443,639, and 7,270,896, among others, can be used.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including: matters of logic with respect to arrangement of steps or operational flow; plain meaning derived from grammatical organization or punctuation; the number or type of embodiments described in the specification.

While the methods and systems have been described in connection with certain embodiments and specific examples, it is not intended that the scope be limited to the particular embodiments set forth, as the embodiments herein are intended in all respects to be illustrative rather than restrictive. Each of the below is incorporated by reference herein in its entirety.

[1] W. Butler, X.- G.-. G. Zhang, T. Schulthess, J. MacLaren, "Spin-dependent tunneling conductance of Fe|MgO|Fe Sandwiches," Phys. Rev. B. 63 (2001).

[2] V. M. Karpan, G. Giovannetti, P. A. Khomyakov, M. Talanana, A. A. Starikov, M. Zwierzycki, J. van den Brink, G. Brocks, and P. J. Kelly, "Graphite and Graphene as Perfect Spin Filters," Phys. Rev. Lett. 99, 176602 (2007).

[3] E. Artacho, J. D. Gale.et al., "SIESTA 2.0 User's Guide" (2016).

[4] T. Bose, R. Cuadrado, R. F. L. Evans, et al., "First-principles study of the Fe| MgO(0 0 1) interface: magnetic anisotropy," J. Phys. Condens. Matter. 28 (2016).

[5] http://revistaialimentos.com/guia/classified/fluoruro-de-potasio-usp--674.html

[6] S. Yuasa, Y. Suzuki, et al., "230% room-temperature magnetoresistance in CoFeB/MgOCoFeB magnetic tunnel junctions," Appl. Phys. Lett. 86, 092502 (2005).

What is claimed is:

1. A magnetic tunnel junction device comprising:
a first device layer comprising a material having a magnetic moment;
a second device layer comprising a material having a magnetic moment; and
a barrier layer having a first interface to the first device layer consisting essentially of a scandium nitride (ScN) material and having a second interface to the second device layer consisting essentially of a scandium nitride (ScN) material;
wherein structures of the first device layer and the second device layer are arranged to invoke a tunneling current depending on magnetization of the magnetic moment of the first device layer and the second device layer;
wherein the barrier layer has a thickness substantially between about 1 nm and about 5 nm; and
wherein the barrier layer is predominantly arranged, or includes a region that is predominantly arranged, in a rocksalt-crystalline structure.

2. The device of claim 1, wherein the first device layer is configured as an electrode.

3. The device of claim 1, wherein the first device layer comprises, at the interface with the barrier layer, a material selected from the group consisting of Fe, Co, Ni, Fe-alloy, Ni-alloy, Fe—Co alloy, Ga, Ga-alloy, Ga—Fe alloy, Fe—Ni—Co alloy, and a combination thereof.

4. The device of claim 1, wherein the first device layer and the second device layer substantially comprise the same material or alloy.

5. The device of claim 1, wherein the first device layer and the second device layer substantially comprise material or alloy having a different magnetic moment at the interface with the barrier layer.

6. The device of claim 1, wherein the magnetic tunnel junction device forms one or more magnetic tunnel junction memory cells in a memory system.

7. The device of claim 6, wherein the memory system is selected from the group consisting of: a spin-transfer torque-magnetic random-access memory (STT-MRAM) device and a spin-orbit torque random-access memory (SOT-MRAM).

8. The device of claim 1, wherein the magnetic tunnel junction device forms one or more magnetic tunnel junction sensors in a sensor device.

9. The device of claim 1, wherein the magnetic tunnel junction device forms one or more magnetic tunnel junction bio-markers.

10. A magnetic random-access memory comprising:
a first device layer comprising a material having a magnetic moment;
a second device layer comprising a material having a magnetic moment; and
a barrier layer having a first interface to the first device layer consisting essentially of a scandium nitride (ScN) material and having a second interface to the second device layer consisting essentially of a scandium nitride (ScN) material;
wherein structures of the first device layer and the second device layer are arranged to invoke a different tunneling current depending on magnetization of the magnetic moment of the first device layer and the second device layer;
wherein the barrier layer has a thickness substantially between about 1 nm and about 5 nm; and
wherein the barrier layer is predominantly arranged, or includes a region that is predominantly arranged, in a rocksalt-crystalline structure.

* * * * *

UNITED STATES PATENT AND TRADEMARK OFFICE
CERTIFICATE OF CORRECTION

PATENT NO. : 12,063,789 B2
APPLICATION NO. : 17/422488
DATED : August 13, 2024
INVENTOR(S) : Jean Anne Incorvia, Suyogya Karki and Daniel S. Marshall It is certified that error appears in the above-identified patent and that said Letters Patent is hereby corrected as shown below:

On the Title Page

Please insert Item (60), on Column 1, Line 12, below the Prior Publication Data "US 2022/0077233 A1" section:
--Related U.S. Application Data (60) Provisional Application No. 62/793,154, filed on Jan. 16, 2019.,-- as a new entry.

Signed and Sealed this
Twenty-fifth Day of March, 2025

Coke Morgan Stewart
*Acting Director of the United States Patent and Trademark Office*